United States Patent [19]

Holmes et al.

[11] Patent Number: 5,374,501
[45] Date of Patent: Dec. 20, 1994

[54] ALKALI SOLUBLE PHOTOPOLYMER IN COLOR PROOFING CONSTRUCTIONS

[75] Inventors: Gary L. Holmes, Vadnais Heights; Mahfuza B. Ali, Mendota Heights; M. Zaki Ali, Mendota Heights, all of Minn.

[73] Assignee: Minnesota Mining and Manufacturing Company, St. Paul, Minn.

[21] Appl. No.: 931,070

[22] Filed: Aug. 17, 1992

[51] Int. Cl.$^5$ .......................... G03C 7/00; G03C 1/72; G03C 1/73
[52] U.S. Cl. .................................. 430/273; 430/287
[58] Field of Search .................. 430/287, 273

[56] References Cited

U.S. PATENT DOCUMENTS

| | | | |
|---|---|---|---|
| 3,060,023 | 10/1962 | Burg et al. | 96/28 |
| 3,060,024 | 10/1962 | Burg et al. | 96/28 |
| 3,060,025 | 10/1962 | Burg et al. | 96/28 |
| 3,136,637 | 6/1964 | Larson | 96/75 |
| 3,481,736 | 12/1969 | Ruff | 96/28 |
| 3,515,552 | 6/1970 | Smith | 96/35.1 |
| 3,536,489 | 10/1970 | Smith | 96/28 |
| 3,607,264 | 9/1971 | Celeste | 96/28 |
| 3,617,288 | 11/1972 | Hartman et al. | 96/90 |
| 3,640,718 | 2/1972 | Smith | 96/89 |
| 3,671,236 | 6/1972 | Van Beusekom | 96/15 |
| 3,729,313 | 4/1973 | Smith | 96/27 R |
| 3,775,113 | 11/1973 | Bonham et al. | 96/28 |
| 3,779,778 | 12/1973 | Smith et al. | 96/115 R |
| 3,787,351 | 1/1974 | Olson | 260/40 R |
| 3,954,475 | 5/1976 | Bonham et al. | 96/67 |
| 3,987,037 | 10/1976 | Bonham et al. | 544/216 |
| 4,058,400 | 11/1977 | Crivello | 96/86 P |
| 4,058,401 | 11/1977 | Crivello | 96/115 |
| 4,076,705 | 2/1978 | Hirai et al. | 260/112.5 |
| 4,304,705 | 12/1981 | Heilmann et al. | 428/260 |
| 4,316,949 | 2/1982 | Petrellis et al. | 430/159 |
| 4,378,411 | 3/1983 | Heilmann et al. | 430/286 |
| 4,386,154 | 5/1983 | Smith et al. | 430/336 |
| 4,460,154 | 7/1984 | Kunkle | 251/130 |
| 4,668,406 | 5/1987 | Chang | 252/8.75 |
| 4,921,827 | 5/1990 | Ali et al. | 502/167 |
| 5,061,583 | 10/1991 | Zwadlo et al. | 430/45 |
| 5,066,559 | 11/1991 | Elmasry et al. | 430/115 |
| 5,089,362 | 2/1992 | Chou et al. | 430/16 |
| 5,235,015 | 8/1993 | Ali et al. | 528/304 |

FOREIGN PATENT DOCUMENTS

0291537A1 11/1988 European Pat. Off. ........ G03C 1/00

*Primary Examiner*—Morton Foelak
*Assistant Examiner*—Jeffrey Culpeper Mullis
*Attorney, Agent, or Firm*—Gary L. Griswold; Walter N. Kirn; Carolyn V. Peters

[57] ABSTRACT

Most color proofing constructions use photooligomers that are tacky, require an oxygen barrier to protect the colorant layer and have a short shelf life. The use of alkali soluble photopolymers in the colorant layer of a color proofing construction provides a more easily processable proofing construction, eliminates the need for an oxygen barrier and has improved shelf life of the photopolymer. The proofing construction has a flexible support base film and a colorant layer coated thereon, wherein the colorant layer comprises a colorant and an alkali soluble photopolymer.

8 Claims, No Drawings

ALKALI SOLUBLE PHOTOPOLYMER IN COLOR PROOFING CONSTRUCTIONS

TECHNICAL FIELD

This invention relates to a color proofing construction, and in particular to a color proofing construction using an alkali soluble photopolymer derived from 2-alkenylazlactone.

BACKGROUND OF THE INVENTION

In the graphics arts, it is often desirable to produce a four or more color proof from image data to assist a printer in correcting a set of color prints prior to using the image data to produce color plates and also to reproduce the color quality that will be obtained during the printing process. The proof must be a consistent duplication of the half tone image from a printing process, and should neither gain nor lose color in comparison to the printed image. Visual examination of a color proof should show the following characteristics:

1. defects on the negatives,
2. best color rendition to be expected from press printing of the material,
3. correct gradation of all colors and whether grays are neutral, and
4. need, if any, for subduing one of the colors and/or giving directions for altering the film negatives before making the printing plates. Color proofing for multi-colored printing without the use of pre-press color proofs are made by using a printing press or a proof press taking all the steps necessary for actual multicolor printing. Such a conventional method of color proofing is costly and time consuming.

Photographic processes are known that use photopolymers. There are various types of photographic color proofing methods, for example, the surprint type (laminated single sheet) and the overlay type.

In the overlay type of color proofing method, an independent transparent plastic support is used for producing a print of each color separation film by applying a photosensitive solution of the corresponding color. A plurality of such supports carrying prints of corresponding colors are then superposed upon each other on a white sheet to produce a color proof. The primary advantage of overlay type of color proofing is that it is quick and can serve as a overlay proof by combining at least colors in register.

In the surprint (adhesively laminated single sheet construction) type of color proofing method, a color proof is prepared by successively producing prints of different colors from different color separation films, respectively, by applying a photosensitive solution or coatings of photopolymers of corresponding color on the opaque support in succession. Alternatively, each color separation can be prepared by applying a photosensitive solution or coating of photopolymers of corresponding color to strippable support base film and then adhesively laminating the separate color prints together, in register, to prepare a full color proof. Some examples are described in U.S. Pat. Nos. 3,671,236 and 3,136,637. An advantage of this surprint type of color proof is that the color saturation is not influenced by the plastic support. This method more closely resembles the actual printing process and eliminates the color distortion inherent in the overlay system.

In addition to overlay or surprint types of color proofing, other processes for producing copies of an image embodying a photopolymerization and thermal transfer techniques are known. Some examples are described in U.S. Pat. Nos. 3,060,023, 3,060,024, 3,060,025, 3,481,736, and 3,607,264. Generally, in these processes, a photopolymerizable layer coated on a suitable support is exposed, imagewise to a process transparency. The surface of the exposed layer is then pressed into contact with the image receptive surface of a separate element and at least one of the elements is heated to a temperature above the transfer temperature of the unexposed portions of the layer. The two elements are then separated, whereby the thermally transferrable, unexposed image areas of the composition transfer to the image receptive element. If the element is not precolored, the tacky unexposed image may now be selectively colored with a desired toner. The colored matter adheres, preferentially, to the clear unpolymerized material. Since lamination, exposure and development are carried out for the respective colors, in sequence, these processes are generally time consuming.

Typically, the proofing constructions add an oxygen barrier between the support base film and the colorant layer. However, such barriers can fracture along the edges of the transparent sheet, or along the peel front, thus permitting entry of oxygen. The oxygen prohibits photopolymerization. Furthermore, several barriers are susceptible to water damage and render the construction ineffective and non-functional.

SUMMARY OF THE INVENTION

Briefly, in one aspect of the present invention a negative proofing film construction is provided comprising:
(a) a flexible support base film; and
(b) a colorant layer comprising a colorant and an alkali soluble photopolymer.

In another aspect of the present invention, a transparent adhesive layer may be added to the construction, with a barrier layer between the colorant layer and the adhesive layer.

Although an oxygen barrier layer is not required in the present invention, such a layer, coated on the colorant layer, may be used, whether or not an adhesive layer is present.

This invention uses an alkali soluble photopolymer derived from 2-alkenylazlactone for use in the color proofing construction. This photopolymer has a number average molecular weight of 20,000 to 2,000,000 Daltons. Additionally, the color proofing construction exhibits excellent shelf stability and oxygen insensitivity. The photopolymers, useful in the present invention, are compatible with a wide variety of polymers including those used for pigment dispersions and binders.

DESCRIPTION OF THE PREFERRED EMBODIMENT(S)

This invention uses an alkali soluble photopolymer in a color proofing construction. A primary application of this invention is an aqueous developable color proofing system. This invention can be used in either a overlay, a single sheet overlay construction or for thermal transfergraphics.

The color proofing construction of the present invention comprises a flexible support base film, and coated thereon, a colorant layer comprising the alkali soluble photopolymer (also referred to as "photopolymer") and a colorant, wherein the colorant layer is an aqueous developable imaging layer.

Contemplated to be within scope of the present invention are various color proofing construction configurations. Amongst the various configurations are the following non-limiting examples:

(1) in sequential order, (a) a flexible support base film, Co) a colorant layer coated thereon, and (c) an oxygen barrier layer coated on the surface of the colorant layer, wherein the surface of the colorant layer is away from the base film;

(2) in sequential order, (a) a flexible support base film, Co) an oxygen barrier layer situated between the base film and a colorant layer, (c) the colorant layer, wherein the base film has a release surface;

(3) in sequential order, (a) a flexible support base film, (b) a colorant layer coated thereon, (c) a barrier layer, and (d) an adhesive layer, wherein the barrier layer protects the colorant layer from the adhesive layer and vice versa;

(4) in sequential order, (a) a flexible support base film, Co) an oxygen barrier layer situated between the base film and a colorant layer, (c) the colorant layer, (d) a barrier layer to protect the colorant layer from an adhesive layer and (e) the adhesive layer, wherein the base film has a release surface;

(5) in sequential order, (a) a flexible support base film, (b) a colorant layer, and (c) an adhesive layer; and (6) in sequential order, (a) a flexible support base film, (b) an oxygen barrier situated between the base film and a colorant layer, (c) the colorant layer, and (d) an adhesive layer.

Alkali soluble photopolymers used in the present invention are energy sensitive polymers having a linear hydrocarbyl backbone and pendent peptide groups with free-radically polymerizable functionality attached thereto, and additionally, at least one organic oxyacid group or salt thereof. These functionalities impart aqueous solubility and polymerizability. The photopolymers are described in U.S. Ser. No. 07/658,983, filed Feb. 21, 1991, and such description is incorporated herein by reference.

The alkali soluble photopolymers useful in the present invention may either be homopolymers or copolymers, wherein the copolymers may be block or random, preferably random, and are described by the following formula:

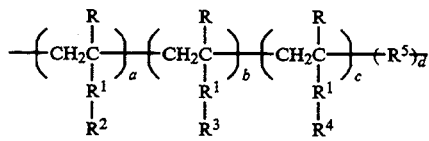

wherein

R can be hydrogen or methyl;

$R^1$ can be represented by

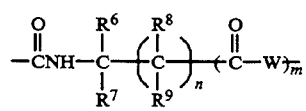

wherein m is 0 for $-R^1-R^4$, and m is 1 for $-R^1-R^2$ and $-R^1-R^3$;

n is 0 or 1;

$R^6$, $R^7$, $R^8$, and $R^9$ can be independently an alkyl group having 1 to 12 carbon atoms or a cycloalkyl group having 5 to 12 carbon atoms, an aryl or aralkyl group having 6 to 12 carbon atoms or at least one of the pairs $R^6$ and $R^7$, and $R^8$ and $R^9$, taken together with the carbon to which it is joined forms a 5- or 6-membered carbocyclic ring, or any of $R^6$, $R^7$, $R^8$ and $R^9$ may be H when n is 1; preferably $R^6$ and $R^7$ are methyl and n is 0;

W can be $-NH-$, $NR^{13}$, $-S-$ or $-O-$, wherein $R^{13}$ can be alkyl of 1 to 12 carbon atoms; preferably W can be $-O-$ or $-NH-$; it is most preferred that W is $-O-$;

$R^2$ (m is 1) can be a polymerizable, ethylenically unsaturated group selected from (a)

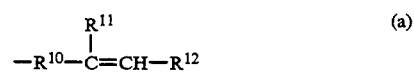

in which $R^{10}$ can be an alkylene group having 1 to 12 carbon atoms, an arylene group having 6 to 10 carbon atoms, an oxyalkylene group or a poly(oxyalkylene) in which the alkylene group has 2 to 4 carbon atoms and the number of oxygen atoms is a positive integer less than or equal to four, most preferably $R^{10}$ has from 1 to 4 carbon atoms; $R^{11}$ is hydrogen, cyano, a carboxyl group, or a $-C(=O)NH_2$ group; and $R^{12}$ is hydrogen, an alkyl group having 1 to 12 carbon atoms, or a phenyl group or naphthyl group optionally having substitution thereon which can be, for example, halogen, an alkyl or alkoxy group from 1 to 4 carbon atoms, or (b) $-R^{10}-W-T$ in which $R^{10}$ is as defined as in (a), W is as previously defined, and T is an ethylenically unsaturated group selected from the group consisting of acryloyl, methacryloyl, cinnamoyl, maleoyl, fumaroyl, itaconoyl, and crotonoyl, and is preferably acryloyl or methacryloyl;

$R^3$ (m is 1) represents hydrogen, or a solubilizing cation such as sodium, potassium, or quaternary ammonium, or $-E-A$ wherein E represents a divalent organic connecting group having up to a total of about 18 C, N, S, and nonperoxidic O atoms, and A is an acid group selected from carboxyl, sulfo, and phospho groups, and salts thereof. $R^3$ may be multifunctional, having more than one group A. Non-limiting examples of E include alkylene and arylene groups (e.g., propane-1,3-diyl, methylene, dodecane1,12-diyl, p-phenylene), oxa-substituted alkylene groups (e.g., 2-oxapropan-1,3-diyl, 3-oxapentan- 1,5-diyl), aza-substituted alkylene groups (e.g., 2-azapropan-1,3-diyl, 3-methyl-3-azapentan-1,5-diyl), and the like. Examples of A include, but are not limited to, carboxy group ($-COOH$), phospho group ($-PO_3H_2$), and sulfo group ($-SO_3H$) and their salts with alkali metals (e.g., sodium, lithium, potassium), mono-, di-, tri-, and tetra-substituted ammonium salts (e.g., ammonium, tetrabutyl ammonium, phenyldipropylammonium). Preferably, A is a carboxyl group, sulfo group, or phospho group or an alkali metal or tetra substituted ammonium salt thereof.

It is possible to incorporated the quaternary ammonium salt group into the polymer by reaction with the formed polymer via a coupling reaction (such as coupling through an azlactone group with a nucleophile substituted quaternary ammonium salt), or by quaternization of a tertiary amine bound to the polymer, it is also possible to copolymerize the photopolymer with a quaternary ammonium salt-containing monomer. It is also possible to incorporate a quaternary ammonium salt into the polymer via neutralization of the polymer after hydrolysis, thus replacing the carboxylate group (when $R^4$ is $-CO_2H$) with tetrabutylammonium hydroxide or tetramethylammonium hydroxide.

$R^4$ (m is 0) represents $-CO_2H$ and salts thereof, carboalkoxy group having from 2 to 40 carbon atoms, or a mono- or dialkylamido group having from 2 to 40 carbon atoms. Preferably $R^4$ is $-CO_2H$ and salts thereof.

a, b, c, and d independently represent a ratio of a monomeric unit to the total number of monomeric units, such that the sum of a+b+c+d equals 1, alternatively, the sum of each of the percents of the single monomeric unit (represented by a, b, and c, and d) of the total number of monomeric units is equal to 100%; preferably a is 0.4–0.6, b is 0.1–0.4, c is 0.2–0.5, and d is 0–0.4, more preferably a is 0.5–0.6, b is 0.1–0.2, c is 0.4–0.5 and d is 0–0.2

When the photopolymer is a copolymer, the photopolymer has "d" monomeric units in range of greater than 0 and up to 0.4, more preferably in the range of greater than 0 and up 0.2. R5 is a unit of the polymer derived from the free radical polymerization of free radically polymerizable monomers. Such monomers include acrylic acid and methacrylic acid, and mono-funtional acrylates and methacrylates, acrylamide and methacrylamides, acrylonitrile and methacrylonitrile, styrene, and N-vinylpyrrolidone. Preferably, the co-monomers include dimethylaminoethyl methacrylate and acrylate, methyl methacrylate, ethyl acrylate, ethylene oxide acrylate, itaconic acid, isooctyl methacrylate, lauryl methacrylate, or salts thereof, preferably quaternary ammonium salts having 4 to 25 carbon atoms, more preferably having 10 to 25 carbon atoms. Examples of preferred quaternary ammonium cations include, but are not limited to, ethyl trimethyl ammonium, tetrabutyl ammonium, hexyltributyl ammonium, tetrahexyl ammonium, methyl tribenzyl ammonium, benzyl trimethyl ammonium, and the like. The anion may be any aqueous solubilizing anion.

The photopolymers are prepared using 2-alkenylazlactone as the polymerizable monomer. 2-Alkenylazlactones are well-known and their synthesis, physical and chemical properties, homo- and copolymerization behavior, and preparations and applications are discussed in a recent review by Rasmussen et at. *Encyclopedia of Polymer Science and Engineering*, "Polyazlactones," 2nd ed.; 1988; Vol. 11, pp 558–571. Useful 2-alkenylazlactones for the present invention include 2-vinyl-4,4-dimethyl-2 -oxazolin-5 -one, 2-isopropenyl-4,4-dimethyl-2-oxazolin-5-one, 2-vinyl-4-ethyl-4-methyl-2-oxazolin-5-one, 2-vinyl-4,4-diethyl-2-oxazolin-5-one, 2-vinyl-4-methyl-4-phenyl-2-oxazolin-5-one, 2-isopropenyl-4,4-tetramethylene-2-oxazolin-5-one, 2-vinyl-4,4-pentamethylene-2-oxazolin-5-one, and 2-vinyl-4,4-dimethyl-2-oxazin-6-one.

Polymerization of the monomers to provide a homopolymer or a copolymer may be accomplished by either thermal (for example through the decomposition of acyl peroxides, dialkyl percarbonates, azoalkanes, etc.) or photochemical (such as photolysis of bisimidazoles, benzoin ethers, aromatic ketones, or halomethyl-s-triazines) means well known in the art.

The polymerized 2-alkenylazlactone is then nucleophilically substituted to give an aqueous soluble photopolymer. The 2-alkenylazlactone residual component, is easily functionalized with a variety of nucleophiles using either acid or base catalysts. The number average molecular weight of the resulting photopolymer, as determined by light scattering techniques, is in the range of 20,000 to 2,000,000 Daltons.

Advantageously, the resulting photopolymer is cross-linkable, non-tacky and easily processed, whereas certain commercial photoligomers are tacky and create processing difficulties. Another advantage is the relative oxygen insensitivity of the photopolymers. Although most commercial photooligomers are sensitive to the quenching effects of oxygen, the photopolymers used in the present invention are unaffected by oxygen and do not require the addition of an oxygen barrier coat, although the use of such an oxygen barrier coat is not outside the scope of the present invention.

The photopolymers are soluble in a variety of solvents including non-chlorinated solvents, such as MEK and water-based solvents, such as water, and water miscible organic solvents. This allows coating of a photopolymer-containing formulation for a color proofing construction from a more environmentally acceptable solvent. The photopolymer is compatible with a wide range of polymers useful in the graphic arts and more particularly with those polymers typically used for pigment dispersions, such as vinyl acetate-vinyl alcohol copolymers. Another advantage of using the in the present invention is improved shelf stability over certain commercially available photooligomers. For example, upon extended storage some photooligomers have been known to gel and have, at most, a three month shelf life, whereas the shelf life for the alkali soluble photopolymer is at least one year.

Referring to the following formula, particularly useful photopolymers are described, wherein $R^6$ and $R^7$ are as described above. As shown, the polymer was functionalized using a base catalyst (diazabicycloundecane) and the nucleophiles (2-hydroxyethylmethylacrylate, aspartic acid mono-tetrabutyl ammonium salt, and water). These nucleophiles functionalize the polymer to provide polymerizability, compatibility and solubility with other polymers and pigments, and developability of the colorant layer.

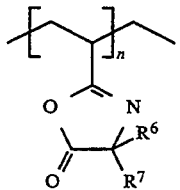

1. HEMA, DBU
2. Aspartic salt, DBU
3. Water, DBU

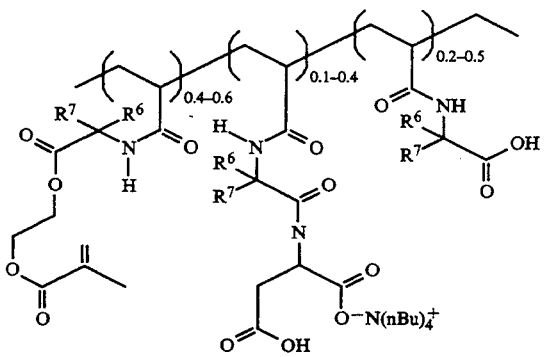

The colorant layer formulation contains various additives in combination with the photopolymers and colorants. Such additives include plasticizers, photoinitiators, coating aids, multifunctional monomers or oligomers (crosslinking enhancers), antioxidants (e.g., ascorbic acid, hindered phenols, phenidone, etc.) in amounts sufficient to prevent premature crosslinking but insufficient to prevent crosslinking of the photopolymers upon addition of actinic radiation, leveling agents, wetting agents (such as those described in U.S. Pat. Nos. 3,787,351 and 4,668,406 and such description is incorporated herein by reference), antistatic agents, waxes, ultraviolet radiation absorbers, mild oxidizing agents, and brighteners may be used without adversely affecting the practice of the invention. These additives may be added in amounts effective for the known function of the materials and generally are in the range of 0.01 to 10.0 percent by weight of the colorant layer formuation (100% solids).

The colorant layer formulation are prepared by dissolving the photopolymers in a suitable solvent to a concentration of about 5-70% by weight, preferably about 10 to 50% by weight. When the photopolymers have been prepared in a solvent, it may be necessary only to add additional solvent to reach the desired concentration. Examples of solvents that can be used include acetone, methyl ethyl ketone, methanol, ethanol, n-propanol, isopropanol, ethyl acetate, benzene, toluene, trichloroethylene and the like. Preferred solvents are the aqueous alcohols and ketones. The coating weight of the colorant layer formulation is typically 0.3 to 5 g/m², preferably 0.5 to 4 g/m², and most preferably 0.5 to 2.5 g/m².

Useful colorants are either pigments or dyes and must have yellow, magenta, cyan and black tones. In addition, metal powders, white pigments, fluorescent pigments, etc., may also be employed. The colorants are generally used as a pigment or dye dispersion, such that the ratio of pigment to dispersing resin is in the range of 1:6 to 6:1, depending on the resin. The amount of pigment or dye dispersions generally range from 10–35 % by weight, depending on the particular color selected. Pigment or dye dispersions are commercially available. Several nonlimiting examples of useful pigments and dyes known in the art are illustrated below. (C.I. means Color Index).

Victoria Pure Blue (C.I. 42595)
Auramine 0 (C.I. 41000)
Cathilon Brilliant Flavin (C.I. basic 13)
Rhodamine 6GCP (C.I. 45 160)
Rhodamine B (C.I. 45170)
Safranine OK70:10 (C.I. 50240)
Erioglaucine X (C.I. 42080)
Fast Black HB (C.I. 26150)
No. 1201 Lionol Yellow (C.I. 21090)
Shimura-Fast Yellow 8GF (C.I. 21105)
Benzidine Yellow 4T-564D (C.I. 21095)
Shimura-Fast Red 4015 (C.I. 12355)
Lionol Red 7B 4401 (C.I. 15850)
Fastogen Blue TGR-L (C.I. 74160)
Lionol Blue SM (C.I. 26150)
Mitsubishi Carbon Black MA-100
Mitsubishi Carbon Black #40

The colorant layer formulation also contains a photoinitiator that may be a single compound or a combination of two or more such compounds that generates radicals upon exposure to actinic radiation or electron beam. Photoinitiation may be direct or sensitized. Preferred photoinitiators are sensitized or unsensitized halomethyltriazines (described, for example, in U.S. Pat. No. 3,775,113) and sensitized diaryliodonium salts (described, for example, in U.S. Pat. Nos. 3,729,313, 4,058,400, 4,058,401, and 4,921,827), hereby incorporated herein by reference. Suitable sensitizers for the preferred photoinitiators, along with effective amounts of initiator are described in the foregoing references. Effective amounts of initiator are typically in the range of 0.01 to 10 weight percent of the total polymerizable composition.

Preferred diaryliodonium salts useful as photoinitiators in practice of the instant invention may be generally described by the formulas as described in U.S. Pat. No. 4,460,154, that is

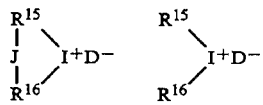

wherein
$R^{15}$ and $R^{16}$ can be individually selected from aromatic groups having from 4 to 20 carbon atoms (e.g., substituted or unsubstituted phenyl, naphthyl, thienyl, and furanyl) with substantially any substitution which does not interfere with the desired reaction, J is selected from a carbon-carbon bond, oxygen, sulfur,

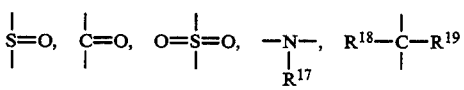

wherein
$R^{17}$ can be aryl (e.g., 6 to 20 carbon atoms) or acyl (e.g., 2 to 20 carbon atoms), $R^{18}$ and $R^{19}$ can be independently selected from hydrogen, alkyl groups of 1 to 4 carbon atoms, and alkenyl groups of 2 to 4 carbon atoms, $D^-$ can be any anion, preferably a complex metal halide such as hexafluorophosphate, hexafluoroarsenate, hexafluoroantimonate, etc.

Examples of preferred diaryliodonium cations are diphenyliodonium, di(4-chlorophenyl)iodonium, 4-trifluoromethylphenylphenyliodonium, 4-ethylphenylphenyliodonium, di(4-acetylphenyl)iodonium, tolylphenyliodonium, anisylphenyliodonium, 4-butoxyphenylphenyliodonium, di(4-phenylphenyl)iodonium, di(carbomethoxyphenyl)iodonium, etc. Examples of other iodonium cations are disclosed in U.S. Pat. Nos. 3,729,313, 4,076,705, and 4,386,154.

Examples of substituted halomethyltriazines useful as photoinitiators are 2,4-bis(trichloromethyl)-6-methyl-s-triazine, 2,4,6-tris(trichloromethyl)-s-triazine, and styryl substituted triazines such as 2,4-bis(trichloromethyl)-6-(4-methoxystyryl)-s-triazine, 2,4-bis(trichloromethyl)-6-(p-dimethylaminostyryl)-s-triazine, 2,4-bis(trichloromethyl)-6-(2′,4′-diethoxystyryl)-s-triazine, etc. These compounds are described as noted above in U.S. Pat. Nos. 3,515,552, 3,536,489, 3,617,288, 3,640,718, 3,779,778, 4,386,154, 3,954,475, and 3,987,037.

Where the term "group" is used in describing substituents of the photoinitiators, substitution is anticipated that does not interfere with the polymerization reaction. For example, the term "alkyl group" includes ether groups (e.g., —$CH_3CH_2CH_2OCH_2$—), haloalkyls, nitroalkyls, carboxyalkyls, hydroxyalkyls, sulfoalkyls, etc. wherein the "term" alkyl includes hydrocarbons of 1 to 20 carbon atoms. Substituents that react with active ingredients, such as strong reducing or oxidizing substituents, are excluded as not being sensitometrically inert or harmless.

It is also within the scope of the invention to include in the colorant layer formuation, 0 to 2.0 part of a co-polymerizable ethylenically unsaturated multifunctional monomer or oligomer per part of the photopolymers by weight in the polymerization compositions as crosslinking enhancers. Non-limiting examples of monomers are (meth)acrylic acid esters such as, for example, ethyl acrylate, butyl acrylate, n-octyl acrylate, allyl acrylate, cyclohexyl acrylate, N-methylcarbamoyloxyethyl acrylate, and multifunctional acrylates and methacrylates such as neopentylglycol diacrylate, 1,6-hexanediol diacrylate, pentaerythritol triacrylate and tetraacrylate, 1,3,5-tri(2-acryloyloxyethyl)isocyanurate, and the corresponding methacrylates. The preferred multifunctional oligomer is hexafunctional acrylate as described in U.S. Pat. No. 4,316,949 and such description is incorporated herein by reference.

A transparent binder may optionally be present in the colorant layer formulation. Any natural or synthetic aqueous solvent-soluble (or nonaqueous solvent-soluble), polymeric binder may be used in the practice of this invention. Organic polymeric resins may be used. Thermoplastic resins are generally preferred. Examples of suitable binders are sulfonated polystyrene, polyvinyl alcohol, starch, polymethyl methacrylate, polyvinyl acetate, and the like. Beyond this minimal requirement of transparency, there is no criticality in the selection of a binder. A generally useful range is up to 30 percent by weight binder, preferably 2 to 15 percent of binder by weight.

Support base films used in the present invention support the colorant layer developable by an aqueous developing solution, thus fixing each of the layers and enabling each of the layers to exert its respective function. The support base film also provides the colorant layer with mechanical strength and dimensional stability in the temperature range between about 0° C to about 200° C. The term "transparent" support as used herein means supports having a thickness of from about 50 micrometers to about 2 millimeters, and more preferably from about 80 micrometers to about 1.5 millimeters, which can transmit not less than about 65%, of incident light with a wavelength of from about 290 nanometers to about 700 nanometers. When the color proofing construction is used for a surprint application or a transfer lithographic application, the support base material need not be transparent, but should provide a release surface, which may either be a smooth surface, or a surface coating thereon.

Suitable support base films include resin-coated paper, various transparent or opaque plastic sheets or films. Suitable transparent or opaque plastic sheets or films include film forming synthetic or high polymers including cellulose nitrate, cellulose acetate, cellulose acetate butyrate, cellulose acetate propionate, polystyrene, polyester, e.g., poly(ethylene terephthalate), poly(vinylidene chloride), poly(vinyl chloride), polypropylene, poly(vinyl acetate), polyisobutylene polymers and copolymers, polycarbonate, etc., and various laminated films of the above described materials. Among these, the preferred support material is a flexible poly(terephthalate ethylene) film.

The adhesive layer comprises a thermally activated adhesive that is coated on the top surface of a barrier layer or the colorant layer. The coating thickness of this layer is generally 5 to 10 g/m$^2$. A thermally activated adhesive layer is preferred over a pressure sensitive adhesive because the thermally activated adhesive can be positioned and repositioned (before lamination) without a chance of altering the receptor surface or picking up extraneous matter as can occur with pressure sensitive adhesive layers. The physical nature of a smooth, transparent and optically clear thermally laminable adhesive layer offers better optical qualities than a pressure sensitive adhesive layer.

The thermally activated adhesive layer preferably provides the following properties:

(1) thermal laminability at a temperature below 200° C., preferably between 100° to 160° C., at a pressure of 1.6 lb/in$^2$ (0.29 kg/cm$^2$), (2) non-tacky at room temperature or preferably not laminable to paper or self-laminable at 45° and 60° C., 2 g/cm$^2$, for at least one week, (3) will not discolor or alter its optical density by more than 0.05 optical density units when an area of 15,000 cm$^2$ is exposed to a 5 kW source of UV radiation having a majority of the radiation distributed over the range of 350 and 450 nm, at a distance of 1 meter for 2 minutes, and (4) have no ingredients which by themselves or in combination with the solvent of the adhesive layer migrate across a barrier layer and desensitize the colorant layer, alter the color or tone of the pigments, or alter the optical qualities of the barrier or colorant layer.

Nonlimiting examples of useful thermal adhesive systems are acrylate polymer and copolymer thermal adhesives with a laminating temperature of 100° to 160° C. at a pressure of 1.6 lb/in$^2$ (0.29 kg/cm$^2$) for 5–10 seconds and nonexclusively include n-butyl acrylate, ethyl acrylate, isopropyl acrylate and their copolymers with ethylenically unsaturated monomers such as other acrylates, acrylic anhydride, acrylic acid, methacrylic acid, styrene, vinyl acetate, and the like. Any monomers that cause yellowing or discoloration when exposed to 5kW UV radiation at about 417 nm at 1 meter for two minutes should be avoided.

Optionally, a barrier layer is added to the color proofing construction when preparing a single sheet proofing construction. Due to colorant migration from the colorant layer to the adhesive layer, it is generally required to physically separate the two layers. This can be accomplished by adding the barrier layer between the colorant layer and the adhesive layer, wherein the barrier layer is farther away from the support base film than the colorant layer. Optical transparency and migration resistance of the pigment between 100° C. and 160° C. are required. Beyond these minimal requirements, there is no criticality in the selection of the barrier layer composition. Suitable examples that can be used in this invention can be an aqueous developable functional material or an aqueous insoluble non-functional material or a mixture thereof. The thickness of the barrier layer may generally range from about 0.1 $g/m^2$ to about 0.3 $g/m^2$.

Since many photopolymerizable constructions utilizing free radical polymerization are affected by oxygen, an oxygen barrier layer is used to protect the colorant layer containing the photopolymer. Advantageously, the photopolymers used in the present invention are relatively oxygen insensitive, thus requiring no oxygen barrier. However, an optional oxygen barrier layer is within the scope of the present invention. Such an oxygen barrier layer comprises polyvinyl alcohol or polyvinyl pyrrolidone. The oxygen barrier layer is typically positioned adjacent to at least one major surface of the colorant layer, that is, the oxygen barrier layer may be between the support base film and the colorant layer, if the support barrier layer is removeable, or the oxygen barrier layer may overlay the colorant layer on the surface away from the support base film. Transparency and satisfactory oxygen impermeability properties between 20° C. and 50° C. are required. Beyond these minimal requirements, there is no criticality in the selection of the oxygen barrier layer composition and such layers as known in the art are within the scope of the present invention.

In preparing an overlay proof, a transparent color proofing construction is provided for each of the colors to be printed. Each of the color constructions is exposed through its respective color separation negative. Upon aqueous processing, the color in the non-image areas is removed, yielding a sheet that contains the desired color pattern in the image areas, while being colorless and transparent in the non-image areas. After the separate colored images are made, they are assembled together in registry on a white or otherwise suitable colored background matching the surface on which printing is to occur.

In preparing a surprint, the colors are processed individually and consecutively. A sheet of the color represented by the first negative to be proofed, for example yellow is prepared for processing by laminating the color sheet to a backing sheet. Pressure applied by conventional laminating apparatus with a heated roller is sufficient to achieve lamination through the thermally laminable adhesive. Following lamination, the support base film is stripped away. The colorant layer now on the backing sheet is contact exposed through the corresponding color separation negative.

The light imaged backing is then physically developed with an aqueous developing solution, brushing and wiping with a soft cloth pad to remove the pigmented resin and unexposed colorant layers from the non-image (unexposed) areas to leave the latter clear and colorless. Thereby an image is defined, faithfully representing the reproduction and full color range which would result if the complete platemaking and printing operation (using appropriately matched ink) were carried through with that color separation negative.

A sheet of second color to be proofed, for example magenta, is prepared in the same way by laminating it to the yellow imaged backing sheet. The corresponding color separation negative must now be positioned in exact register with the yellow image. This is commonly provided for by a preregistration of all the separation negatives and the backing sheet by a system of register marks or punches. The colorant layer (magenta) now on the yellow-imaged backing sheet is exposed and processed, as for the first color (yellow). The remaining cyan and black images are thereafter added, in turn, thus reproducing the four color result that would occur in printing, were printing plates employed prepared from the same color separation negatives.

Certain relationship should exist between the elements of the color proofing construction just described. Adhesive relationships must be such that, after adhesive lamination to the backing sheet, the release surface will allow stripping away the support base film without disrupting the adhesive bond. Failure must not occur at either the adhesive-backing sheet or adhesive-barrier layer bonds. When the release surface is provided by a surface coating on the support base film, it is not particularly critical whether release occurs between support base film-release layer or release layer-colorant layer. However, release is generally less efficient between two in situ formed layers and results in somewhat more likely release between the support base film and the release layer. In this event, it is of importance that the release layer be transparent and soluble in the aqueous developing solution.

The color proofing construction of the present invention is exposed imagewise to actinic light. Preferably, the wavelength of the actinic light used at the wavelength of maximum sensitivity of the colorant layer. The imagewise exposure can be carded out using known methods for light sensitive materials. Examples of suitable light sources which can be employed are a high pressure mercury arc lamp, a ultra-high pressure mercury arc lamp, a carbon arc, a xenon arc lamp, a laser, a tungsten filament incandescent lamp, a luminescent discharge tube, a cathode ray tube, sunlight, etc. The intensity of the actinic light is so selected that the exposure time is in the range of from about 0.1 seconds to about 1 minutes, and more preferably from about 0.5 to about 15 seconds.

After imagewise exposure, the color proofing construction is processed using an aqueous developing solution, wherein the unexposed portions of the colorant layer are dissolved away in the aqueous developing solution. The remaining areas, that is, the exposed areas of the colorant layer and the adhesive layer (if present) constitute an image.

The term "aqueous developing solution" as employed in the description of the present invention means water per se, mixtures of water and water-miscible organic solvents, water containing an alkaline compound, and mixtures of water, water-miscible organic solvents and an alkaline compound. Useful water-miscible organic solvents form a homogenous phase when mixed with water in particular ratios of about 50% by volume or less, preferably about 25% by volume or less and more preferably about 5% by volume or less of the organic solvent to the total volume of the mixture. Such suitable water-miscible organic solvents include aliphatic alcohols containing up to 6 carbon atoms, for example, methanol, ethanol, propanol, butanol, 2-proponal, t-butyl alcohol, isoamyl alcohol, and 1-hexanol. Suitable alkaline compound that can be used include sodium hydroxide, potassium hydroxide, lithium hydroxide, sodium phosphate, potassium phosphate, sodium carbonate, sodium bicarbonate, potassium carbonate, potassium bicarbonate, sodium silicate, and potassium silicate. Preferably, the aqueous developing solution is water, sodium bicarbonate, potassium carbonate mixed with a surfactant, such as Surfonyl (Union Carbide).

Regardless of the presence of the water-miscible organic solvent, the amount of the alkaline compound in the aqueous developing solution should not exceed about 20% by weight, and more preferably should be from about 0.5 to 10% by weight, of the total amount of the aqueous developing solution. The pH should range from about 7 to about 13.5, which shifts to about 7 to about 12 or to a pH in the range of 7 to 11 when a water-miscible organic solvent is present.

The developing solution can also contain a surface active agent [such as those described in J. Grant, Ed. *Hackh's Chemical Dictionary*, 4th Ed., McGraw-Hill Book Co., New York (1969)].

Objects and advantages of this invention are further illustrated by the following examples, but the particular materials and amounts thereof recited in these examples, as well as other conditions and details, should not be construed to unduly limit this invention. All materials are commercially available or known to those skilled in the art unless otherwise stated or apparent. $\overline{M}_n$ is the number average molecular weight.

EXAMPLES

The photopolymers were prepared using 2-alkenylazlactone as the monomer in MEK using an initiator. The monomer and initiator mixture was heated to produce a quantative conversion of the monomer to an alkenylazlactone polymer. In Examples 1–28, the initiator was azobisisobutyronitrile.

The thermally-polymerized polymer was then functionalized using the substituents in the amounts summarized in Table 1. The preparation of the the nucleophilic substituents are described in U.S. Serial No. 07/658,983, filed Feb. 21, 1991 in Examples 1–15 and such description is incorporated herein by reference.

To a solution of thermally-polymerized polymer were added a nucleophilic substituent, a thermal stabilizer (3,5-di-t-butyl-4-hydroxytoluene), base catalyst (1,8-diazabicyclo[5.4.0]undec-7-ene)and MEK. The solution was heated for 4 hours. The solution was allowed to cool to room temperature and the aspartate (aspartic acid mono-tetrabutylammonium salt dissolved in MEK) was added. The solution was stirred at room temperature for about 4 hours to yield a polymer having the substituents summarized in Table 1. Any remaining unreacted VDM groups were hydrolyzed by water and the base catalyst. In some cases, the carboxylate, resulting from the hydrolysis step, was neutralized with tetrabutylammonium hydroxide [HON(Bu)$_4$]or tetramethylammonium hydroxide [HON(Me)$_4$].

TABLE 1

| Example | Functionalization (Nucleophiles) (equivalent % to VDM) | | | | | $\overline{M}_n$ |
|---|---|---|---|---|---|---|
| | HEMA | Carboxylate | Aspartate | N(Bu)$_4$ | N(Me)$_4$ | |
| 1 | 40 | 50 | 10 | — | — | 125K |

TABLE 1-continued

| Example | Functionalization (Nucleophiles) (equivalent % to VDM) | | | | | $\overline{M}_n$ |
|---|---|---|---|---|---|---|
| | HEMA | Carboxylate | Aspartate | N(Bu)$_4$ | N(Me)$_4$ | |
| 2 | 40 | 50 | — | 10 | — | 125K |
| 3 | 40 | 40 | — | 20 | — | 125K |
| 4 | 40 | 50 | — | — | 10 | 125K |
| 5 | 40 | 30 | — | — | 30 | 125K |
| 6 | 50 | 40 | 10 | — | — | 125K |
| 7 | 50 | 40 | — | 10 | — | 125K |
| 8 | 50 | 30 | — | 20 | — | 125K |
| 9 | 50 | 50 | — | — | — | 125K |
| 10 | 50 | 30 | 20 | — | — | 125K |
| 11 | 50 | 40 | — | — | 10 | 125K |
| 12 | 50 | — | — | 50 | — | 125K |
| 13 | 55 | — | 45 | — | — | 125K |
| 14 | 55 | 35 | 10 | — | — | 125K |
| 15 | 55 | 25 | 20 | — | — | 125K |
| 16 | 55 | 30 | 15 | — | — | 125K |
| 17 | 60 | 30 | 10 | — | — | 125K |
| 18 | 60 | 20 | — | 20 | — | 125K |
| 19 | 60 | 30 | — | 10 | — | 125K |
| 20 | 60 | 10 | — | 30 | — | 125K |
| 21 | 60 | 30 | — | — | 10 | 125K |
| 22 | 45 | 45 | 10 | — | — | 125K |
| 23 | 50 | 50 | — | — | — | 120K |
| 24 | 55 | 30 | 15 | — | — | 167K |
| 25 | 55 | 30 | 15 | — | — | 250K |
| 26 | 55 | 30 | 15 | — | — | 500K |
| 27 | 45 | 30 | 25 | — | — | 1M |
| 28 | 35 | 30 | 35 | — | — | 1M |

Example 29

A typical colorant formulation utilizing a photopolymer for an overlay proofing construction is given below:

| Component (% Solids) | Wt (g) | Wt Solids (g) | % Solids |
|---|---|---|---|
| multifunctional oligomer (50%) | 1.488 | 0.744 | 27.4 |
| photopolymer (33%) (Example 6) | 3.924 | 1.295 | 47.9 |
| MEK | 5.288 | — | — |
| wetting agent | 0.052 | 0.052 | 1.9 |
| colorant | 4.995 | 0.4995 | 18.5 |
| photoinitiator | 0.115 | 0.115 | 4.3 |
| Total | 15.862 | 2.706 | 100.1 |

The multifunctional oligomer, a hexafunctional acrylate, was derived from TDI (toluene diisocyanate) and prepared as described in U.S. Pat. No. 4,316,949 and such description is incorporated herein by reference. MEK (methylethylketone) is a non-chlorinated hydrocarbon solvent. The wetting agent (commercially available from 3M Co. under the trade name of "Fluorinert FC 430") is included to improve wetting of the formulation during the coating step. The colorant was a 10% solution in MEK of pigment, phthalocyanine (Sun Chemical) in this case, dispersed in vinyl copolymers, (commerically available from Union Carbide under the trade name of "VAGH"). The dispersion was a 1:1 ratio of pigment and vinyl copolymers. The photoinitiator used was 2,4-bis(trichloromethyl)-6-(3'-hydroxystyryl)-s-triazine.

This colorant formulation was coated onto 3 mil PET (commercially available from ICI under the trade designation "505") using a #6 Meyer bar, dried for 2 minutes in a convection oven at 200° F., and gave a dry coating weight of approximately 1.2 g/m$^2$. The coated construction was then exposed imagewise through a Plate Control Wedge (Ugra, St. Gall, Switzerland, "UGRA target") to actinic radiation using a Berkey-Ascor 5 kW vacuum frame exposure unit for 10 to 50 units in increments of 10 units. The imagewise exposed construction was developed using an aqueous developer solution comprised of .1% KHCO$_3$, 1% K$_2$CO$_3$, and 0.1% Surfynol 465 (Union Carbide).

The image of the developed construction was evaluated using a ten power eyepiece on a light table. The best image resulted from 40 units (20 seconds), which gave a solid four on a $\sqrt{2}$ graduated grayscale. The 2% and hard dots and screens were held as were the positive six microlines.

Example 30

A green shade cyan coating solution formulation for a single sheet proofing application is given below:

| Component (% Solids) | Wt (g) | Wt Solids (g) | % Solids |
|---|---|---|---|
| multifunctional oligomer (50%) | 1.165 | 0.582 | 24.9 |
| photopolymer (33%) (Example 6) | 3.319 | 1.095 | 46.9 |
| MIEK | 5.440 | — | — |
| wetting agent | 0.056 | 0.056 | 2.4 |
| colorant | 4.834 | 0.4834 | 20.7 |
| photoinitiator | 0.119 | 0.119 | 5.1 |
| Total | 14.993 | 2.335 | 100.0 |

This colorant formulation was prepared using the multifunctional oligomer, wetting agent, colorant, and photoinitiator described in Example 29. The photopolymer formulation was coated onto a support base film of polyester with PVA release coating using a #6 Meyer bar, dried for 2 minutes in a convection oven at 200° F. and gave a dry coating weight of approximately 1.2 g/m$^2$. A barrier solution comprised of 5% photopolymer (Example 6), 1% photoinitiator (Example 29), in MEK was coated onto the colorant layer using a Meyer bar, dried for 2 minutes in a convection oven at 200° F. and gave a dry coating weight of approximately 0.5 g/m$^2$.

The coated construction was then coated with an acrylic thermal adhesive (Reichold Chemical) using a #6 Meyer bar, dried for 2 minutes in a convection oven at 200° C., and gave a dry coating weight of approximately 1.5 g/m$^2$. This construction was then laminated to a paper base (coated on both sides with polyethylene) using a hot roll lamination processor operating at 280° F. for the upper roll and 180° F. for the lower roll and a transport speed of 4.

The support base film was removed and the colored construction exposed to actinic radiation using a Berkey-Ascor 5 kW vacuum frame exposure unit through an UGRA target with 20 to 80 units in increments of 20 units. The imagewise exposure construction was developed using an aqueous developer solution described in Example 29. The 60 unit exposure gave the best image as determined by eye using a 10× eyepiece. The image displayed 2 and 98 dots and screens and complete 8 positive and negative microlines.

Example 31

A magenta colorant formulation for an overlay color proofing application is given below:

| Component (% Solids) | Wt (g) | Wt Solids (g) | % Solids |
|---|---|---|---|
| multifunctional oligomer (50%) | 1.112 | 0.556 | 24.2 |
| photopolymer (33%) (Example 6) | 3.384 | 1.117 | 48.5 |
| MEK | 5.402 | — | — |
| wetting agent | 0.035 | 0.035 | 1.5 |
| colorant | 4.826 | 0.4826 | 21.0 |
| photoinitiator | 0.110 | 0.110 | 4.8 |
| Total | 14.869 | 2.301 | 100.0 |

This colorant formulation was prepared using the multifunctional oligomer, wetting agent, and photoinitiator described in Example 29. The colorant was a 10% solution in MEK of quinacridone, blue shade magenta (Sun Chemical), dispersed in vinyl copolymers (commerically available from Union Carbide under the trade name of "VAGH"). The dispersion was a 1:1 ratio of pigment and vinyl copolymers. This formulation was coated onto an adhesion promoted polyester using a #13 Meyer bar, dried for 2 minutes in a convection oven at 200° F. and gave a dry coating weight of approximately 1.5 g/m$^2$. This coated construction was exposed imagewise through an UGRA target to actinic radiation using a 5 kW Berkey-Ascor vacuum frame exposure unit with 20 to 80 units. The imagewise exposed construction was developed using an aqueous developer solution described in Example 29. The 40 unit exposure gave the best image as determined using a 10x eye piece. The image displayed 2 and 98 dots and screens and complete 6 positive and negative microlines.

Example 32

A magenta colorant formulation for a single sheet color proofing application is given below:

| Component (% Solids) | Wt (g) | Wt Solids (g) | % Solids |
|---|---|---|---|
| multifunctional oligomer (50%) | 1.838 | 0.919 | 39.5 |
| photopolymer (33%) (Example 6) | 2.277 | 0.751 | 32.3 |
| MEK | 5.448 | — | — |
| wetting agent | 0.056 | 0.056 | 2.4 |
| colorant | 4.834 | 0.4834 | 20.8 |
| photoinitiator | 0.119 | 0.119 | 5.1 |
| Total | 14.572 | 2.328 | 100.1 |

This colorant formulation was prepared using the multifunctional oligomer, wetting agent, and photoinitiator described in Example 29 and the magenta colorant described in Example 31. This formulation was coated onto a support base film of PVA pre-coated polyester (ICI Americas) using a #6 Meyer bar, dried for 2 minutes in a convection oven at 200° F. and gave a dry coating weight of approximately 1.2 g/m$^2$. A barrier solution comprising 5% photopolymer (Example 6), 1% photoinitiator (Example 29), in MEK was coated onto the color layer using a #6 Meyer bar, dried for 2 minutes in a convection oven at 200° F. and gave a coating weight of approximately 0.5 g/m$^2$. The layered construction was then coated with an acrylic thermal adhesive (Reichold Chemical) using a #6 Meyer bar, dried for 2 minutes at 200° F. in a convection oven and gave a dry coating weight of approximately 1.5 g/m$^2$.

The layered construction was then laminated to a paper base (coated on both sides with polyethylene) using a hot roll lamination processor operating at 280° F. for the upper roll and 180° F. for the lower roll and a transport speed of 4.

The support base film was removed and the colored construction exposed to actinic radiation using a Berkey-Ascor 5 kW vacuum frame exposure unit through an UGRA target with 20 to 80 units in increments of 20 units. The imagewise exposed construction was developed using an aqueous developer solution described in Example 29. The 60 unit exposure gave the best image as determined using a 10× eye piece. The image displayed 2 and 98 dots and screens and complete 8 positive and negative microlines.

Example 33

A black colorant formulation for an overlay color proofing application is given below:

| Component (% Solids) | Wt (g) | Wt Solids (g) | % Solids |
| --- | --- | --- | --- |
| multifunctional oligomer (50%) | 0.1024 | 0.0512 | 13.7 |
| photopolymer (33 %) (Example 6) | 0.2492 | 0.0806 | 21.6 |
| MEK | 0.2888 | — | — |
| wetting agent | 0.0187 | 0.0082 | 2.2 |
| colorant | 1.9858 | 0.1986 | 53.1 |
| photoinitiator | 0.0351 | 0.0351 | 9.4 |
| Total | 2.6750 | 0.3787 | 100.0 |

This colorant formulation was prepared using the multifunctional oligomer, wetting agent, and photoinitiator described in Example 29. The colorant was a 10% solution in MEK of carbon black (Sun Chemical) dispersed in vinyl copolymers (commercially available from Union Carbide under the trade name of "VAGH"). The dispersion was a 1:1 ratio of pigment and vinyl copolymers. This formulation was coated onto an adhesion promoted polyester using a #13 Meyer bar, dried for 2 minutes in a convection over at 200° F. and gave a dry coating weight of approximately 1.5 g/m². This coated construction was exposed imagewise through an UGRA target to actinic radiation using a kW Berkey-Ascor vacuum frame exposure unit with 20 to 80 units. The imagewise exposed construction was developed using an aqueous developer solution described in Example 29. The 40 unit exposure gave the best image as determined using a 10× eye piece. The image displayed 2 and 98 dots and screens and complete 6 positive and negative microlines.

Example 34

A black colorant formulation for a single sheet color proofing application is given below:

| Component (% Solids) | Wt (g) | Wt Solids (g) | % Solids |
| --- | --- | --- | --- |
| multifunctional oligomer (50%) | 132.8 | 66.4 | 20.4 |
| photopolymer (33%) (Example 6) | 320.5 | 105.8 | 32.5 |
| MEK | 1430.7 | — | — |
| wetting agent | 17.6 | 7.73 | 2.4 |
| colorant | 932.9 | 43.29 | 28.7 |
| photoinitiator | 51.9 | 51.90 | 16.0 |
| Total | 2886.4 | 325.12 | 100.0 |

This colorant formulation was prepared using the multifunctional oligomer, wetting agent, and photoinitiator described in Example 29 and the black colorant described in Example 33. This formulation was coated onto a support base film of PVA pre-coated polyester (ICI Americas) using a #6 Meyer bar, dried for 2 minutes in a convection oven at 200° F. and gave a dry coating weight of approximately 1.2 g/m². A barrier solution comprising 5% photopolymer (Example 6), 1% photoinitiator (Example 29), in MEK was coated onto the color layer using a #6 Meyer bar, dried for 2 minutes in a convection oven at 200° F. and gave a coating weight of approximately 0.5 g/m². The layered construction was then coated with an acrylic thermal adhesive (Reichold Chemicals) using a #6 Meyer bar, dried for 2 minutes at 200° F. in a convection oven and gave a dry coating weight of approximately 1.5 g/m². The layered construction was then laminated to a paper base (coated on both sides with polyethylene) using a hot roll lamination processor operating at 280° F. for the upper roll and 180° F. for the lower roll and a transport speed of 4.

The support base film was removed and the colored construction exposed to actinic radiation using a Berkey-Ascor 5 kW vacuum frame exposure unit through an UGRA target with 20 to 80 units in increments of 20 units. The imagewise exposed construction was developed using an aqueous developer solution described in Example 29. The 60 unit exposure gave the best image as determined using a 10× eye piece. The image displayed 2 and 98 dots and screens and complete 8 positive and negative microlines.

Example 35

A yellow colorant formulation for an overlay color proofing application is given below:

| Component (% Solids) | Wt (g) | Wt Solids (g) | % Solids |
| --- | --- | --- | --- |
| multifunctional oligomer (50%) | 61.7 | 30.85 | 21.1 |
| photopolymer (33 %) (Example 6) | 161.0 | 53.13 | 36.3 |
| MEK | 704.3 | — | — |
| wetting agent | 15.2 | 6.67 | 4.6 |
| colorant | 202.6 | 40.52 | 27.7 |
| photoinitiator | 15.2 | 15.20 | 10.4 |
| Total | 1160.0 | 146.37 | 100.1 |

This colorant formulation was prepared using the multifunctional oligomer, wetting agent, and photoinitiator described in Example 29. The colorant was a 10% solution in MEK of di-arylide (green-shade yellow) pigment dispersed in vinyl copolymers (commercially available from Union Carbide under the trade name of "VAGH"). The dispersion was a 1:1 ratio of pigment and vinyl copolymers. This formulation was coated onto an adhesion promoted polyester (ICI Americas, #505) using a #13 Meyer bar, dried for 2 minutes in a convection oven at 200° F. and gave a dry coating weight of approximately 1.5 g/m². This coated construction was exposed imagewise through an UGRA target to actinic radiation using a 5 kW Berkey-Ascor vacuum frame exposure unit with 20 to 80 units. The imagewise exposed construction was developed using an aqueous developer solution described in Example 29. The 40 unit exposure gave the best image as determined using a 10× eye piece. The image displayed 2 and 98 dots and screens and complete 6 positive and negative microlines.

Example 36

A yellow colorant formulation for a single sheet color proofing application is given below:

| Component (% Solids) | Wt (g) | Wt Solids (g) | % Solids |
|---|---|---|---|
| multifunctional oligomer (50%) | 132.8 | 66.4 | 20.4 |
| photopolymer (33 %) (Example 6) | 320.5 | 105.8 | 32.5 |
| MEK | 1430.7 | — | — |
| wetting agent | 17.6 | 7.73 | 2.4 |
| colorant | 932.9 | 43.29 | 28.7 |
| photoinitiator | 51.9 | 51.90 | 16.0 |
| Total | 2886.4 | 325.12 | 100.0 |

This colorant formulation was prepared using the multifunctional oligomer, wetting agent, and photoinitiator described in Example 29, and the yellow colorant described in Example 35. This formulation was coated onto a support base film of PVA pre-coated polyester (ICI Americas) using a #6 Meyer bar, dried for 2 minutes in a convection oven at 200° F. and gave a dry coating weight of approximately 1.2 g/m². A barrier solution comprising 5% photopolymer (Example 6), 1% photoinitiator (Example 29), in MEK was coated onto the color layer using a #6 Meyer bar, dried for 2 minutes in a convection oven at 200° F. and gave a coating weight of approximately 0.5 g/m². The layered construction was then coated with an acrylic thermal adhesive (Reichold Chemicals) using a #6 Meyer bar, dried for 2 minutes at 200° F. in a convection oven and gave a dry coating weight of approximately 1.5 g/m². The layered construction was then laminated to a paper base (coated on both sides with polyethylene) using a hot roll lamination processor operating at 280° F. for the upper roll and 180° F. for the lower roll and a transport speed of 4.

The support base film was removed and the colored construction exposed to actinic radiation using a Berkey-Ascor 5 kW vacuum frame exposure unit through an UGRA target with 20 to 80 units in increments of 20 units. The imagewise exposed construction was developed using an aqueous developer solution described in Example 29. The 60 unit exposure gave the best image as determined using a 10× eye piece. The image displayed 2 and 98 dots and screens and complete 8 positive and negative microlines.

Example 37

A cyan colorant formulation for a single sheet color proofing application is given below:

| Component (% Solids) | Wt (g) | Wt Solids (g) | % Solids |
|---|---|---|---|
| multifunctional oligomer (50%) | 1.740 | 0.870 | 23.7 |
| photopolymer (33 %) (Example 6) | 4.130 | 1.363 | 37.1 |
| MEK | 4.992 | — | — |
| wetting agent | 0.365 | 0.160 | 4.4 |
| colorant | 3.306 | 1.124 | 30.6 |
| photoinitiator | 0.161 | 0.161 | 4.4 |
| Total | 14.694 | 3.678 | 100.2 |

This colorant formulation was prepared using the crosslinker, wetting agent, cyan colorant, and photoinitiator described in Example 29. This formulation was coated onto a support base film of biaxially oriented polypropylene (BOPP) (Toray) using a #8 Meyer bar, dried in a convection oven at 200° F. for 2 minutes and gave a dry coating weight of approximately 0.7 g/m².

The colored construction was exposed to actinic radiation using a Berkey-Ascor 5 kW vacuum frame exposure unit through an UGRA target with to 80 units in increments of 20 units. The imaged layer was laminated with a piece of double sided polyethylene coated paper (receptor) using a hot roll lamination processor operating at 280° F. for the upper roll and 180° F. for the lower roll and a transport speed of 4.

After cooling, the two layer construction was peeled apart to afford a positive (transfer image) on the receptor and a negative image on the BOPP.

Example 38

A transfer lithographic proofing construction as described in U.S. Ser. No. 07/728,311, filed Jul. 8, 1991 may be constructed using alkali soluble photopolymers. In the transfer lithographic proofing composite construction, an intermediate transfer sheet and an intermediate receptor sheet is used. A yellow construction prepared according to Example 35 is laminated to an intermediate receptor sheet (a support base film coated with a reusable release layer) using a hot roll lamination processor operating at 280° F. for the upper roll and 180° F. for the lower roll and a transport speed of 4. The yellow construction is then exposed to actinic radiation using a Berkey-Ascor 5 kW vacuum frame exposure unit through a color separation. The imagewise exposure is developed using the aqueous developer solution described in Example 29. Exposure durations depend on the reflection characteristics of the flexible support base film used in the intermediate receptor sheet.

The proofing composite construction is completed by laminating, exposing, developing the cyan, magenta, and black color constructions described in Examples 30, 32, and 34, respectively. There is no need for additional intermediate receptor sheets, since the constructions described in Examples 30, 32 and 34 are coated with a thermally transferable adhesive. However, the overlay constructions of Examples 29, 31, and 33 can also be used by first laminating the color construction to an intermediate transfer sheet (a PET carrier film coated with a thermally transferable adhesive). The PET film is removed and the single color construction is then laminated to the composite construction, exposed, and developed. This is continued until a final composite image (all the colors) is obtained.

Once the final composite image is constructed, the base film of the intermediate receptor sheet is removed. The final composite image is then laminated to a transfer sheet. The PET film can then be removed and the final composite image with adhesive is laminated to any support made of paper, plastic, or metal, which can pass through the lamination step to effect the transfer of the final composite image.

Various modifications and alterations of this invention will become apparent to those skilled in the art without departing from the scope and principles of this invention, and it should be understood that this invention is not to be unduly limited to the illustrative embodiments set forth hereinabove. All publications and patents are herein incorporated by reference to the same extent as if each individual publication or patent was specifically and individually indicated to be incorporated by reference.

We claim:

1. A proofing construction comprising:
   (a) a flexible support base film; and
   (b) a colorant layer comprising a colorant and an alkali soluble photopolymer, wherein the alkali soluble photopolymer is described by the following formula:

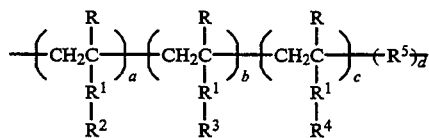

wherein
R is hydrogen or methyl;
$R^1$ is represented by

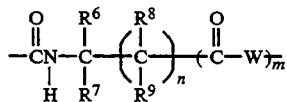

wherein
the carbon atom of the amido group of $R^1$ adjacent to the carbon atom bearing $R^6$ and $R^7$ is covalently bonded to a carbon atom of the polymer backbone; and
m is 0 for $R^1 R^4$, and m is 1 for $R^1 R^2$ and $R^1 R^3$;
n is 0 or 1;
$R^6$, $R^7$, $R^8$, and $R^9$ is independently an alkyl group having 1 to 12 carbon atoms or a cycloalkyl group having 5 to 12 carbon atoms, an aryl or aralkyl group having 6 to 12 carbon atoms or one of the pairs $R^6$ and $R^7$, or $R^8$ and $R^9$, taken together with the carbon atom to which it is joined forms a 5- or 6-membered carbocyclic ring, or any of $R^6$, $R^7$, $R^8$ and $R^9$ may be H when n is 1;
W is —NH—, $NR^{20}$, —S— or —O—, wherein $R^{20}$ can be alkyl of 1 to 12 carbon atoms;
$R^2$ (m is 1) is a group selected from
(1)

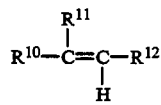 (1)

in which $R^{10}$ is an alkylene group having 1 to 12 carbon atoms, an arylene group having 6 to 10 carbon atoms, an oxyalkylene group or a poly-(oxyalkylene) in which the alkylene group has 2 to 4 carbon atoms and the number of oxygen atoms is a positive integer less than or equal to four; $R^{11}$ is hydrogen, cyano, a carboxyl group, or a —C(=O)NH$_2$ group; and $R^{12}$ is hydrogen, an alkyl group having 1 to 12 carbon atoms, or a phenyl group or naphthyl group, optionally having substitution thereon which can be halogen, an alkyl or alkoxy group from 1 to 4 carbon atoms, or (2) —$R^{10}$—W—T in which $R^{10}$ is as defined as in (1), W is as previously defined, and T is an ethylenically unsaturated group selected from the group consisting of acryloyl, methacryloyl, cinnamoyl, maleoyl, fumaroyl, itaconoyl, and crotonoyl;

$R^3$ (m is 1) represents hydrogen, or a solubilizing cation such as sodium, potassium, or quaternary ammonium, or —E—A wherein E represents a trivalent or divalent organic connecting group having up to a total of about 18 C, N, S, and non-peroxidic O atoms, and A is an acid group selected from carboxyl, sulfo, and phospho groups, and salts thereof; further $R^3$ may be multifunctional, having more than one group A;

$R^4$ (m is 0) represents —CO$_2$H and salts thereof, carboalkoxy group having from 2 to 40 carbon atoms, or a mono- or dialkylamido group having from 2 to 40 carbon atoms;

$R^5$ represents the co-monomeric unit after polymerization, wherein the co-monomers are acrylic acid and methacrylic acid, and monofunctional acrylates and methacrylates, acrylamides and methacrylamides, acrylonitrile and methacrylonitrile, styrene, and N-vinylpyrrolidone; and a, b, c, and d independently represent a ratio of a monomeric unit to the total number of monomeric units, wherein a is 0.4–0.6, b is 0.1–0.4, c is 0.2–0.5, and d is 0–0.4, provided the sum of a+b+c+d equals 1.

2. The proofing construction according to claim 1, wherein $R^6$ and $R^7$ are methyl groups and n is equal to 0.

3. The proofing construction according to claim 1, wherein W is —O— or —NH—.

4. The proofing construction according to claim 1, wherein $R^3$ is a quaternary ammonium.

5. The proofing construction according to claim 1, wherein $R^4$ is —CO$_2$H.

6. The proofing construction according to claim 1, further comprising a transparent barrier layer and a transparent adhesive layer, such that the barrier layer is between the colorant layer and the adhesive layer.

7. The proofing construction according to claim 1, further comprising a transparent oxygen barrier layer, coated on the surface of the colorant layer not adjacent to the flexible support base film.

8. The proofing construction according to claim 1, wherein the alkali soluble photopolymer is described by the following formula:

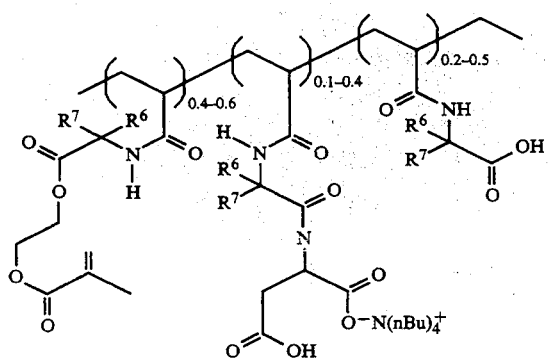
wherein
R[6] and R[7] is independently a hydrogen, an alkyl group having 1 to 12 carbon atoms or a cycloalkyl group having 5 to 12 carbon atoms, an aryl or aralkyl group having 6 to 12 carbon atoms, or R[6] and R[7], taken together with the carbon to which it is joined forms a 5- or 6-membered carbocyclic ring.
* * * * *

UNITED STATES PATENT AND TRADEMARK OFFICE
CERTIFICATE OF CORRECTION

PATENT NO.: 5,374,501

DATED: Dec. 20, 1994

INVENTOR(S): Holmes et al.

It is certified that error appears in the above-identified patent and that said Letters Patent is hereby corrected as shown below:

Col. 3, line 8, Delete "Co)" and insert --(b)--

Col. 3, line 13, Delete "Co)" and insert --(b)--

Col. 3, line 22, Delete "Co)" and insert --(b)--

Col. 4, line 47, Delete "0" and insert --O--

Col. 6, line 36, Insert --photopolymer-- between "the" and "in"

Col. 7, line 67, Delete the space between "45" and "160"

Col. 8, line 40, Insert a space between "$R^{16}$" and "can"

Col. 9, line 9, Delete "(4-" and insert --(4'--

Col. 14, Example 23, Delete "120K" and insert --20K--

Col. 15, line 13, Insert --98%-- after "and"

Col. 15, line 41, Insert --#6-- after "a"

Col. 17, line 47, Delete "kW" and insert --5kW--

Col. 19, line 17, Delete "oHgomer" and insert --oligomer--.

UNITED STATES PATENT AND TRADEMARK OFFICE
CERTIFICATE OF CORRECTION

PATENT NO. : 5,374,501

DATED : Dec. 20, 1994

INVENTOR(S) : Holmes et al

It is certified that error appears in the above-indentified patent and that said Letters Patent is hereby corrected as shown below:

Col. 20, line 19, Insert --20-- after "with"

Signed and Sealed this

Seventeenth Day of October, 1995

Attest:

BRUCE LEHMAN

*Attesting Officer*  *Commissioner of Patents and Trademarks*